US012787355B2

(12) United States Patent
Ina et al.

(10) Patent No.: US 12,787,355 B2
(45) Date of Patent: Nov. 3, 2026

(54) SEMICONDUCTOR DEVICE AND METHOD FOR PRODUCING SEMICONDUCTOR DEVICE

(71) Applicant: TOYODA GOSEI CO., LTD., Kiyosu (JP)

(72) Inventors: Tsutomu Ina, Kiyosu (JP); Takatomi Izumi, Kiyosu (JP)

(73) Assignee: Toyoda Gosei Co., Ltd., Kiyosu-shi (JP)

( * ) Notice: Subject to any disclaimer, the term of this patent is extended or adjusted under 35 U.S.C. 154(b) by 435 days.

(21) Appl. No.: 18/213,661

(22) Filed: Jun. 23, 2023

(65) Prior Publication Data

US 2024/0014316 A1 Jan. 11, 2024

(30) Foreign Application Priority Data

Jul. 5, 2022 (JP) ................................ 2022-108364

(51) Int. Cl.

| | |
|---|---|
| ***H10D 30/66*** | (2025.01) |
| ***H10D 30/01*** | (2025.01) |
| ***H10D 62/85*** | (2025.01) |
| ***H10D 64/23*** | (2025.01) |

(52) U.S. Cl.

CPC ....... *H10D 30/668* (2025.01); *H10D 30/0297* (2025.01); *H10D 62/8503* (2025.01); *H10D 64/256* (2025.01)

(58) Field of Classification Search

CPC ........................ H10D 62/8503; H10D 30/668

See application file for complete search history.

(56) References Cited

U.S. PATENT DOCUMENTS

| | | | | |
|---|---|---|---|---|
| 10,192,967 | B2 * | 1/2019 | Saitoh | H10D 62/393 |
| 2009/0321854 | A1 | 12/2009 | Ohta et al. | |
| 2010/0193862 | A1 | 8/2010 | Kanazawa | |

(Continued)

FOREIGN PATENT DOCUMENTS

| | | |
|---|---|---|
| JP | 2008-078604 A | 4/2008 |
| JP | 2010-182857 A | 8/2010 |

(Continued)

OTHER PUBLICATIONS

Japanese Office Action dated Jun. 24, 2025 in Japanese Patent Application No. 2022-108364 with English machine translation.

*Primary Examiner* — Ali Naraghi

(74) *Attorney, Agent, or Firm* — McGinn IP Law Group, PLLC

(57) ABSTRACT

A semiconductor device of trench gate type is formed of a group III nitride semiconductor. The semiconductor device has a substrate, a first layer, a second layer, and a third layer accumulated in this order, and further has a trench penetrating through the third layer and the second layer and reaching the first layer. A side surface of the trench, exposed to the second layer, is perpendicular to a main surface of the substrate. A side surface of the trench, exposed to the third layer, includes a first region which is perpendicular to the main surface of the substrate, and a second region above the first region, which is inclined with respect to the main surface of the substrate. A cross-sectional area of the trench at the second region in a plane parallel to a bottom surface of the trench increases from a bottom toward an upper of the trench.

20 Claims, 9 Drawing Sheets

(56) References Cited

U.S. PATENT DOCUMENTS

| | | | | |
|---|---|---|---|---|
| 2013/0126904 | A1* | 5/2013 | Masuda | H10D 12/031 257/77 |
| 2015/0295079 | A1* | 10/2015 | Nakano | H10D 12/031 257/330 |
| 2016/0276450 | A1 | 9/2016 | Kobayashi | |
| 2018/0026131 | A1* | 1/2018 | Kurosaki | H10D 12/038 257/59 |
| 2021/0257216 | A1 | 8/2021 | Yasunishi et al. | |

FOREIGN PATENT DOCUMENTS

| | | | |
|---|---|---|---|
| JP | 2016-174027 | A | 9/2016 |
| JP | 2018-129558 | A | 8/2018 |
| JP | 2021-129057 | A | 9/2021 |

* cited by examiner

SEMICONDUCTOR DEVICE AND METHOD FOR PRODUCING SEMICONDUCTOR DEVICE

CROSS-REFERENCE TO RELATED APPLICATIONS

This application claims priority from Japanese Patent Application No. 2022-108364 filed on Jul. 5, 2022, the entire subject-matter of which is incorporated herein by reference.

TECHNICAL FIELD

The present disclosure relates to a semiconductor device of trench gate type, formed of a group III nitride semiconductor, and a method for producing the semiconductor device.

BACKGROUND ART

In a trench type vertical MISFET, a trench having a depth reaching a drift layer formed of $n^-$-GaN is formed in a semiconductor layer in which the drift layer, a channel layer formed of p-GaN, and a contact layer formed of $n^+$-GaN are sequentially stacked, a gate insulating film is formed continuously on a bottom surface, a side surface, and an upper surface (a region in the vicinity of the trench on a surface of the semiconductor layer) of the trench, and further a gate electrode is formed via the gate insulating film.

It is difficult to cover a corner portion formed by the side surface of the trench and a surface of the contact layer with the gate electrode, and a coating defect is likely to occur. When a coating defect of the gate electrode occurs, it is concerned that an operation defect or an increase in resistance of the MISFET may occur.

Therefore, as disclosed in JP2008-078604A, it is considered that coverage of the gate electrode is improved by forming a cross section of the trench into a V-shape.

However, when the cross section of the trench is made into a V-shape as described in JP2008-078604A, a channel length (a length of a side of a channel layer exposed on the side surface of the trench) increases in length, and thus an on-resistance deteriorates.

SUMMARY OF INVENTION

An object of the present disclosure is to provide a semiconductor device of trench gate type, formed of a group III nitride semiconductor, which enables to prevent an increase in on-resistance while improving coverage of a gate electrode.

The present disclosure relates to a semiconductor device formed of a group III nitride semiconductor, of trench gate type, including: a substrate; a first layer formed of an n-type group III nitride semiconductor and provided on the substrate; a second layer formed of a p-type group III nitride semiconductor and provided on the first layer; a third layer formed of an n-type group III nitride semiconductor and provided on the second layer; and a trench provided in a partial region of a surface of the third layer and having a depth penetrating through the third layer and the second layer and reaching the first layer, in which a region on a side surface of the trench where the second layer is exposed is perpendicular to a main surface of the substrate, and a region on the side surface of the trench where the third layer is exposed includes a first region from a surface of the second layer to a predetermined height in the third layer, and a second region from the predetermined height in the third layer to the surface of the third layer, the first region being perpendicular to the main surface of the substrate, the second region being inclined with respect to the main surface of the substrate, a cross-sectional area of the trench at the second region in a plane parallel to a bottom surface of the trench increasing from a bottom surface side toward an upper surface side of the trench.

In the semiconductor device according to the present disclosure, the semiconductor device may further include: an ion implantation region formed by implanting ions into a predetermined region of the surface of the second layer; and a p-type impurity region formed in a region having a predetermined depth from the surface of the first layer and a width of the second layer under the ion implantation region.

In the semiconductor device according to the present disclosure, an inclination angle of the second region may be 150 to 75°.

In the semiconductor device according to the present disclosure, a width of the second region in a direction parallel to the main surface of the substrate may be 0.1 μm to 0.3 μm.

The present disclosure also relates to a method for producing a semiconductor device formed of a group III nitride semiconductor, of trench gate type, including: a first process of forming, on a substrate, a first layer formed of an n-type group III nitride semiconductor, a second layer formed of a p-type group III nitride semiconductor, and a third layer formed of an n-type group III nitride semiconductor in this order; a second process of forming, in a partial region of a surface of the third layer, a trench having a depth penetrating through the third layer and the second layer and reaching the first layer, a side surface of the trench being perpendicular to a main surface of the substrate; and a third process of etching the side surface of the trench, a region on the side surface of the etched trench where the third layer is exposed including a first region from a surface of the second layer to a predetermined height in the third layer, and the second region from the predetermined height in the third layer to the surface of the third layer, the first region being perpendicular to the main surface of the substrate, the second region being inclined with respect to the main surface of the substrate, a cross-sectional area of the etched trench at the second region in a plane parallel to a bottom surface of the etched trench increasing from a bottom surface side toward an upper surface side of the etched trench.

In the method according to the present disclosure, the third process may be a process of dry-etching an entire upper surface of a wafer.

In the method according to the present disclosure, the first process may include a process of implanting ions into a predetermined region of the surface of the second layer to form an ion implantation region, the process being performed after formation of the second layer and before formation of the third layer, the method further may include a fourth process of diffusing a p-type impurity in the second layer by heat treatment to form a p-type impurity region in a region having a predetermined depth from the surface of the first layer and a width of the second layer under the ion implantation region, the fourth process being performed after the second process and before the third process, and the third process also may serve to remove thermal damage generated on the side surface of the trench due to the fourth process.

According to the present disclosure, an increase in on-resistance can be prevented while improving coverage of a gate electrode. As a result, stability of an operation of the device can be improved.

DESCRIPTION OF EMBODIMENTS

Hereinafter, embodiments of the present disclosure will be described with reference to the drawings.

First Embodiment

Figure 1:
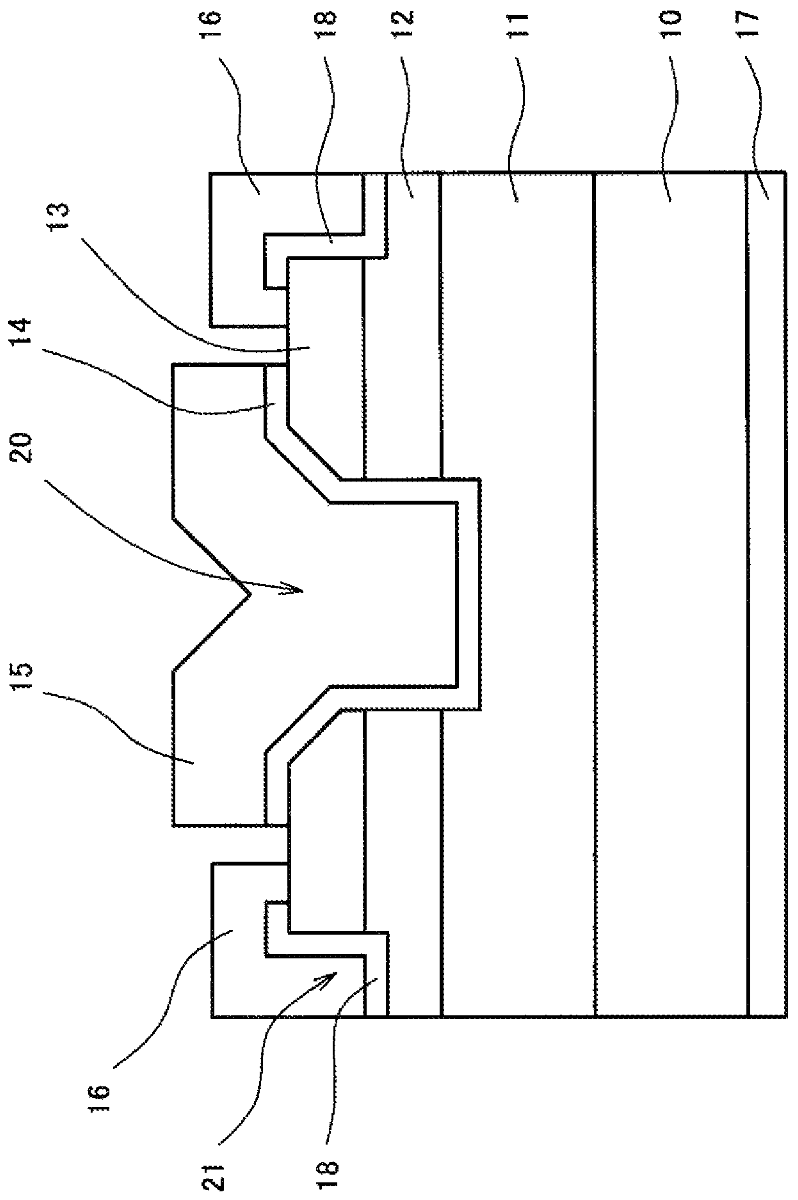
FIG. 1 is a view illustrating a configuration of a semiconductor device according to a first embodiment.

FIG. 1 is a view illustrating a configuration of a semiconductor device according to a first embodiment. The semiconductor device according to the first embodiment is a vertical FET having a trench gate structure, and includes a substrate 10, a drift layer 11, a channel layer 12, a contact layer 13, a gate insulating film 14, a gate electrode 15, source electrodes 16, a drain electrode 17, and body electrodes 18 as illustrated in FIG. 1.

The substrate 10 is formed of Si-doped $n^+$-GaN having a c-plane as a main surface. A Si concentration of the substrate 10 is $1\times10^{18}/cm^3$ or more. A material of the substrate 10 may be a material other than GaN, and any material can be used as long as the material can grow a group III nitride semiconductor and has conductivity. For example, Si, SiC, ZnO, or the like can be used.

The drift layer 11 is provided on the substrate 10. The drift layer 11 is formed of Si-doped $n^-$-GaN. A thickness of the drift layer 11 is 8 μm to 15 μm. In addition, a Si concentration of the drift layer 11 is $1\times10^{15}/cm^3$ to $5\times10^{16}/cm^3$.

The channel layer 12 is provided on the drift layer 11. The channel layer 12 is formed of Mg-doped p-GaN. A thickness of the channel layer 12 is 0.1 μm to 1 μm. In addition, a Mg concentration of the channel layer 12 is $1\times10^{17}/cm^3$ to $8\times10^{19}/cm^3$.

The contact layer 13 is provided on the channel layer 12. The contact layer 13 is formed of Si-doped $n^+$-GaN. A thickness of the contact layer 13 is 0.1 μm to 0.5 μm. In addition, a Si concentration of the contact layer 13 is $1\times10^{18}/cm^3$ to $1\times10^{19}/cm^3$.

A trench 20 is provided in a partial region of a surface of the contact layer 13. A depth of the trench 20 is a depth penetrating through the contact layer 13 and the channel layer 12 and reaching the drift layer 11. The drift layer 11 is exposed at a bottom surface of the trench 20. In addition, the drift layer 11, the channel layer 12, and the contact layer 13 are exposed on a side surface of the trench 20 in this order from a bottom surface side thereof. Hereinafter, on the side surface of the trench 20, a region where the drift layer 11 is exposed is referred to as 20*a*, a region where the channel layer 12 is exposed is referred to as 20*b*, and a region where the contact layer 13 is exposed is referred to as 20*c*.

Figure 2:
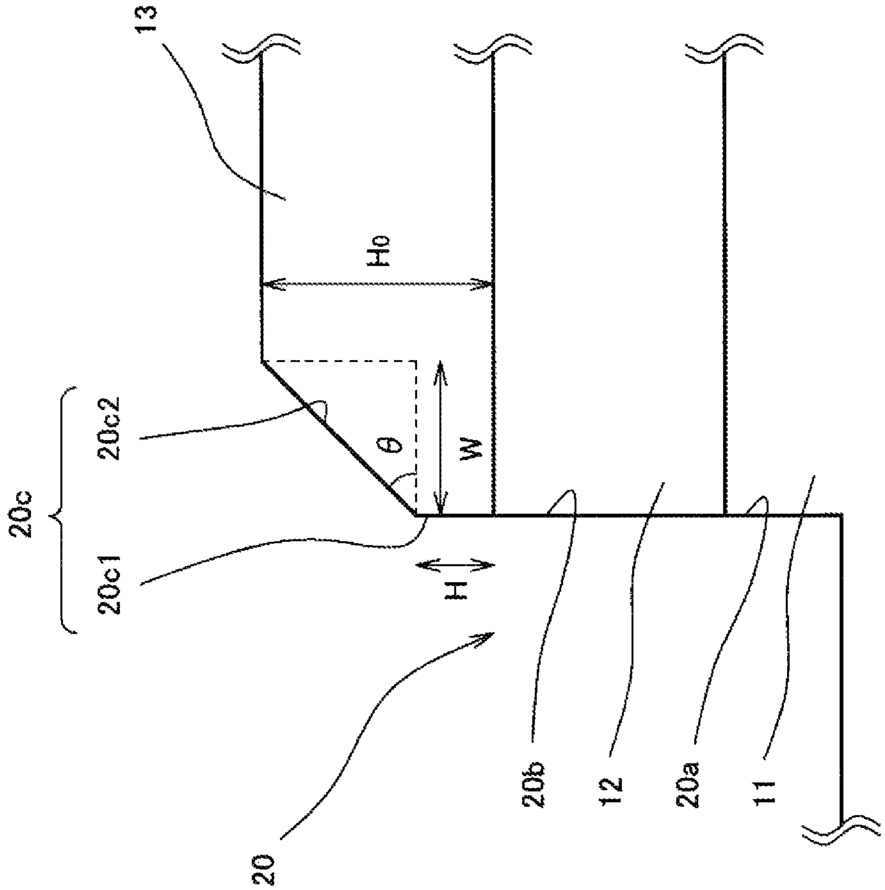
FIG. 2 is an enlarged view of a part of a trench 20.

FIG. 2 is an enlarged view of a part of the trench 20. As illustrated in FIG. 2, the regions 20*a* and 20*b* on the side surface of the trench 20 where the drift layer 11 and the channel layer 12 are exposed are perpendicular to the main surface of the substrate 10. On the other hand, in the region 20*c* on the side surface of the trench 20 where the contact layer 13 is exposed, a region 20*c*1 from a surface of the channel layer 12 to a certain height H in the contact layer 13 is perpendicular to the main surface of the substrate 10, and a region 20*c*2 from the height H in the contact layer 13 to an upper surface of the trench 20 (a region in the vicinity of the trench 20 on the surface of the contact layer 13) is inclined by an angle of θ with respect to the main surface of the substrate 10. The inclination is such an inclination that a cross-sectional area of the trench 20 at the region 20*c*2 in a plane parallel to a bottom surface of the trench 20 increases from the bottom surface side toward an upper surface side of the trench 20.

As described above, the trench 20 has a shape in which a corner portion formed by the side surface and the upper surface of the trench 20 is chamfered. Therefore, the gate electrode 15 is not largely bent at the corner portion formed by the side surface and the upper surface of the trench 20, and is bent stepwise at a gentle angle. Therefore, coverage of the gate electrode 15 can be improved.

Although a length of the region 20*b* on the side surface of the trench 20 where the channel layer 12 is exposed is a channel length, since the region 20*b* is perpendicular to the main surface of the substrate 10, there is no change in the channel length as compared with a structure in the related art (when an entire region of the side surface of the trench 20 is perpendicular thereto). Therefore, an increase in on-resistance can be prevented while improving the coverage of the gate electrode 15.

In addition, since the corner portion formed by the side surface and the upper surface of the trench 20 has a chamfered shape, a path of a current flowing on the surface of the contact layer 13 is shortened. As a result, resistance of the device can be reduced.

The regions 20*b* and 20*c*1 on the side surface of the trench 20 do not need to be strictly perpendicular to the main surface of the substrate 10, and an angle thereof may be in a range of 80° to 90°. In addition, the region 20*a* on the side surface of the trench 20 may be perpendicular or inclined. For example, an angle thereof may be 450 to 90°.

The inclination angle θ of the region 20*c*2 on the side surface of the trench 20 is any value as long as the value is larger than 0° and smaller than inclination angles of the other regions (20*a*, 20*b*, and 20*c*1) on the side surface, and is preferably 15° to 75°. Within this range, the coverage of the gate electrode 15 can be further improved. In addition, the inclination angle θ may change stepwise or continuously.

A width W of the region 20*c*2 (a width in a direction parallel to the main surface of the substrate 10, and W=(H0−H)/tan θ when the thickness of the contact layer 13 is referred to as H0) is preferably 0.1 μm to 0.3 μm. Within this range, the coverage of the gate electrode 15 can be further improved.

The height H may be any value as long as the value is equal to or greater than 0 and equal to or less than the thickness of the contact layer 13, and the height H is preferably set such that the inclination angle θ is 15° to 75° and the width W is 0.1 μm to 0.3 μm.

A recess 21 is provided in a region different from a formation region of the trench 20 in the partial region of the contact layer 13. The recess 21 is a groove having a depth penetrating through the contact layer 13 and reaching the channel layer 12. A side surface of the recess 21 may be perpendicular or inclined with respect to the main surface of the substrate 10.

The gate insulating film 14 is provided continuously over the bottom surface, the side surface, and the upper surface of the trench 20. The gate insulating film 14 is formed of $SiO_2$, for example.

The gate electrode 15 is provided across the bottom surface, the side surface, and the upper surface of the trench 20 via the gate insulating film 14. The gate electrode 15 is formed of TiN, for example. Here, since the region 20*c*2 on the side surface of the trench 20 is inclined, the coverage of the gate electrode 15 can be improved.

The body electrode 18 is provided continuously over a bottom surface, the side surface, and an upper surface (a region in the vicinity of the recess 21 on the surface of the contact layer 13) of the recess 21. The body electrode 18 is formed of Ni, for example.

The source electrode 16 is provided on the contact layer 13 and the body electrode 18. The source electrode 16 is formed of Pd/Al/Ti, for example.

The drain electrode 17 is provided on a rear surface of the substrate 10. The drain electrode 17 is formed of Pd/Al/Ti, for example.

As described above, in the semiconductor device according to the first embodiment, the region on the side surface of the trench 20 where the contact layer 13 is exposed is inclined. Therefore, an increase in on-resistance can be prevented while improving the coverage of the gate electrode 15. As a result, stability of an operation of the device can be improved.

Next, a method for producing a semiconductor device according to the first embodiment will be described.

Figure 3A:
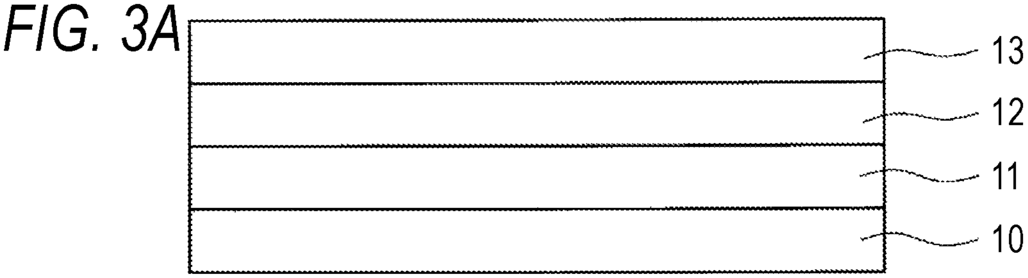
FIGS. 3A, 3B, 3C, and 3D are views illustrating a process of producing the semiconductor device according to the first embodiment.

First, the drift layer 11, the channel layer 12, and the contact layer 13 are formed in this order on the substrate 10 by a MOCVD method (see FIG. 3A).

Figure 3B:
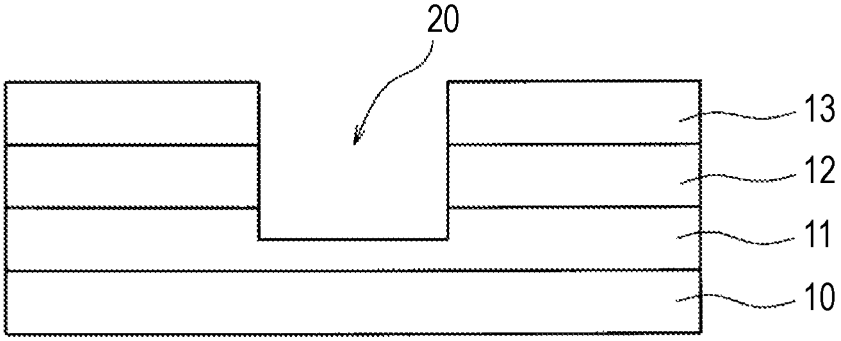

Next, a predetermined region of the contact layer 13 is dry-etched until reaching the drift layer 11 to form the trench 20 (see FIG. 3B). Etching conditions are set such that the side surface of the trench 20 is perpendicular to the main surface of the substrate 10.

Figure 3C:
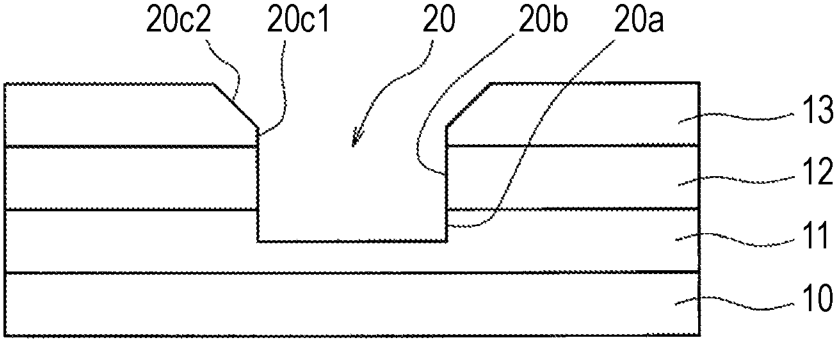

Next, an entire upper surface of a wafer is dry-etched. Since a convex portion on the upper surface is preferentially etched, the corner portion formed by the side surface and the upper surface of the trench 20 is preferentially etched. As a result, the corner portion is chamfered to form an inclined side surface in the region 20*c*2 on the side surface of the trench 20, and the other regions 20*a*, 20*b*, and 20*c*1 on the side surface remain perpendicular thereto (see FIG. 3C).

A chlorine-based gas such as $Cl_2$, $BCl_3$, or $SiCl_4$ is used as an etching gas. In particular, $Cl_2$ is preferable. This is because adhesion of impurities (B or Si) to the channel layer 12 exposed on the side surface of the trench 20 can be prevented.

In addition, since the dry-etching is performed on the entire upper surface and no mask is used, a margin for mask formation is not necessary. Therefore, the device can be miniaturized, and chip resistance can be reduced by the miniaturization.

Wet-etching may be used instead of the dry-etching. However, in a case of wet-etching, it is necessary to cover a region not to be etched with a mask. As a wet-etching solution, an aqueous solution such as a TMAH can be used. In addition, in a case of wet-etching using the TMAH, a specific plane orientation (c-plane or m-plane) can be expressed on the side surface of the trench 20 due to anisotropy, and thus the on-resistance can be reduced. Further, since an etching rate becomes very slow at a stage where the specific plane orientation is expressed, the TMAH functions as an etching stopper and is excellent in reproducibility of the shape and the like.

Figure 3D:
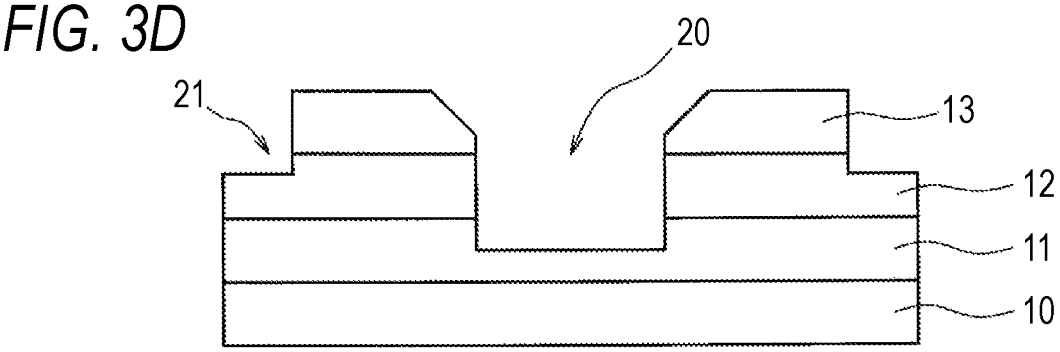

Next, the recesses 21 are formed by dry-etching predetermined regions of the contact layer 13 until reaching the channel layer 12 (see FIG. 3D). After the trench 20 and the recesses 21 are formed, the entire upper surface of the wafer may be dry-etched. In this case, since a corner of the recess 21 can also be chamfered, coverage of the body electrode 18 and the source electrode 16 can be improved.

Figure 4A:
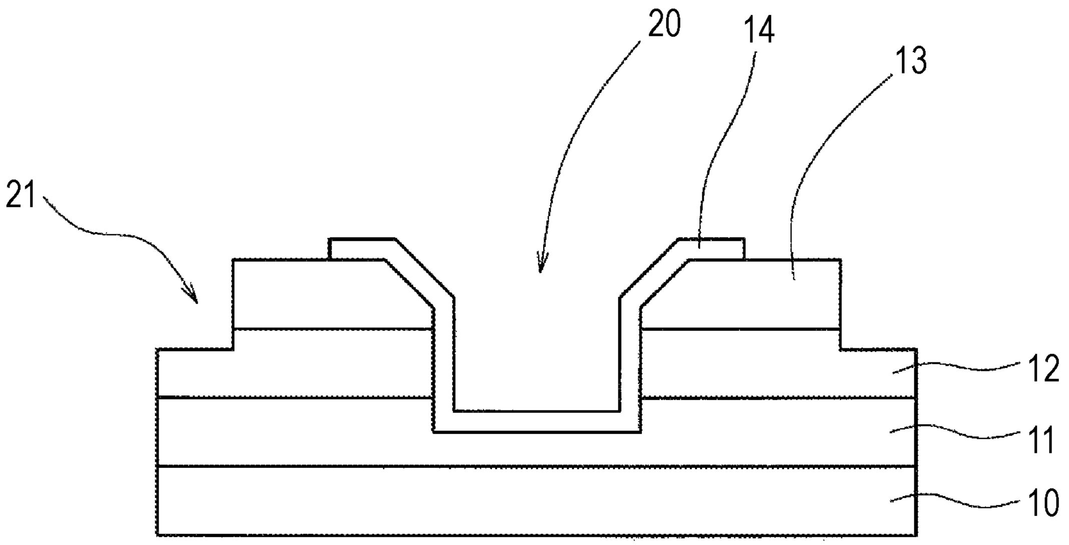
FIGS. 4A and 4B are views illustrating a process of producing the semiconductor device according to the first embodiment.

Next, the gate insulating film 14 is continuously formed over the bottom surface, the side surface, and the upper surface of the trench 20 by an ALD method (see FIG. 4A).

Figure 4B:
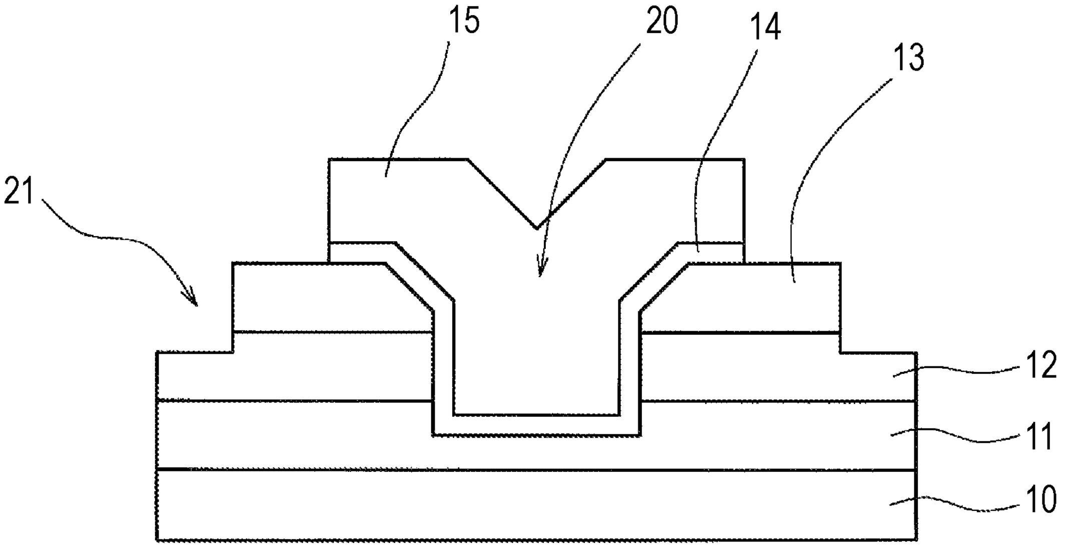

Next, the gate electrode 15 is formed on the bottom surface, the side surface, and the upper surface of the trench 20 via the gate insulating film 14 by vapor deposition or sputtering (see FIG. 4B). Here, the region 20*c*2 on the side surface of the trench 20 is inclined, and the corner portion formed by the side surface and the upper surface of the trench 20 has a chamfered shape. Therefore, bending of the gate electrode 15 becomes gentle at the corner portion, the gate electrode 15 can be easily formed along the corner portion, and the coverage of the gate electrode 15 can be improved.

Next, the body electrode 18 is formed continuously on the bottom surface, the side surface, and the upper surface of the recess 21, and the source electrode 16 is formed on the contact layer 13 and the body electrode 18. Next, a drain electrode is formed on the rear surface of the substrate 10. The body electrode 18, the source electrode 16, and the drain electrode 17 are formed by vapor deposition or sputtering, and are patterned by lifting off. Thus, the semiconductor device according to the first embodiment is produced.

Second Embodiment

Figure 5:
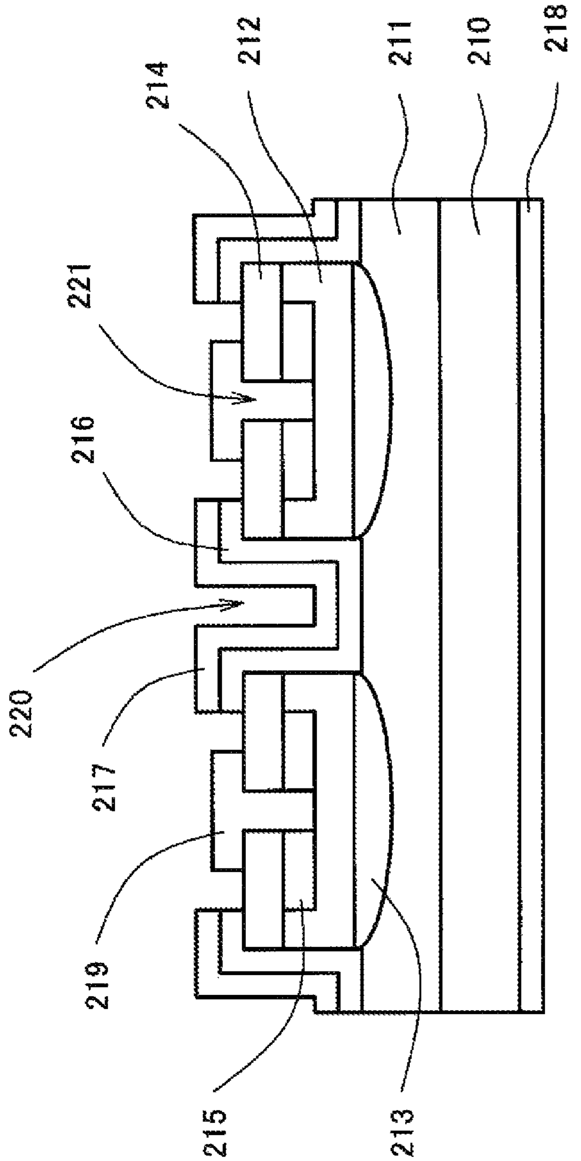
FIG. 5 is a view illustrating a configuration of a semiconductor device according to a second embodiment.

FIG. 5 is a view illustrating a configuration of a semiconductor device according to a second embodiment. As illustrated in FIG. 5, the semiconductor device according to the second embodiment is a vertical FET of a trench gate structure formed of a group III nitride semiconductor, and includes a substrate 210, a first n-type layer (drift layer) 211, a first p-type layer (channel layer) 212, p-type impurity regions 213, a second n-type layer (contact layer) 214, ion implantation regions 215, a gate insulating film 216, a gate electrode 217, a drain electrode 218, and source electrodes 219 as illustrated in FIG. 5.

The substrate 210 is formed of Si-doped n-GaN having a c-plane as a main surface. A material of the substrate 210 is not limited to GaN, and any material can be used as long as the material is a conductive material allowing crystal growth of a group III nitride semiconductor.

The first n-type layer 211 formed of Si-doped n-GaN, the first p-type layer 212 formed of Mg-doped p-GaN, and the second n-type layer 214 formed of Si-doped n-GaN are stacked in this order on the substrate 210. An impurity concentration of each layer is, for example, as follows. A Si concentration of the first n-type layer 211 is $1\times10^{15}/cm^3$ to $2.5\times10^{16}/cm^3$, a Mg concentration of the first p-type layer 212 is $1\times10^{17}/cm^3$ to $2\times10^{19}/cm^3$, and a Si concentration of the second n-type layer 214 is $1\times10^{18}/cm^3$ to $1\times10^{19}/cm^3$. In addition, a thickness of each layer is, for example, 10 μm for the first n-type layer 211, 1 μm for the first p-type layer 212, and 0.2 μm for the second n-type layer 214.

Figure 6:
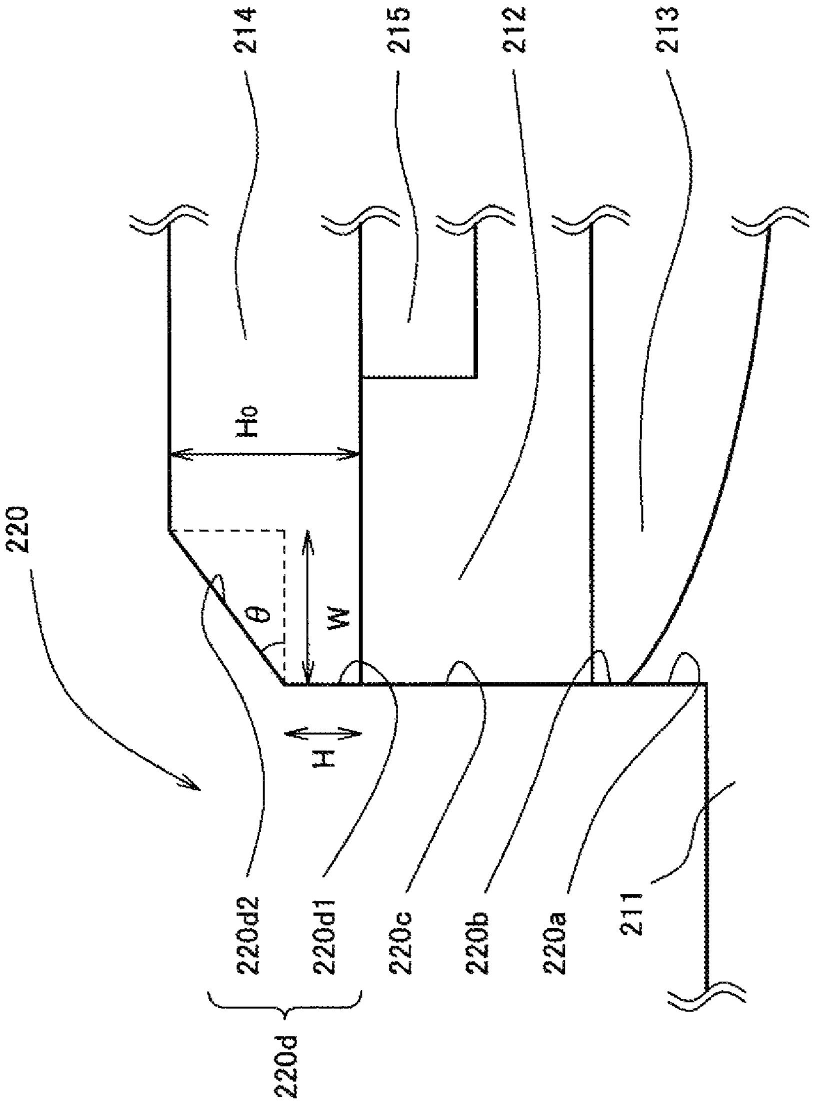
FIG. 6 is an enlarged view illustrating a part of a trench 220.

A trench 220 is provided in a predetermined region of a surface of the second n-type layer 214. FIG. 6 is an enlarged view of a part of the trench 220. The trench 220 is a groove having a depth penetrating through the second n-type layer 214 and the first p-type layer 212 and reaching the first n-type layer 211. The first n-type layer 211 is exposed on a bottom surface of the trench 220, and the first n-type layer 211, the p-type impurity region 213, the first p-type layer 212, and the second n-type layer 214 are exposed on a side surface in this order from a bottom surface side. Hereinafter, on the side surface of the trench 220, a region where the first n-type layer 211 is exposed is referred to as 220*a*, a region where the p-type impurity region 213 is exposed is referred to as 220*b*, a region where the first p-type layer 212 is exposed is referred to as 220*c*, and a region where the second n-type layer 214 is exposed is referred to as 220*d*.

A planar pattern of the trench 220 is, for example, a honeycomb shape, and the first p-type layer 212 and the second n-type layer 214 are partitioned into a regular hexagonal planar pattern. A width of the trench 220 is, for example, 1.6 μm to 5 μm. A depth of the trench 220 is any value as long as the first n-type layer 211 is exposed, and is preferably set to a depth of 0.1 μm to 0.5 μm from the surface of the second n-type layer 214. This is to reliably expose the first n-type layer 211.

As illustrated in FIG. 6, the regions 220*a*, 220*b*, and 220*c* on the side surface of the trench 220 where the first n-type layer 211, the p-type impurity region 213, and the first p-type layer 212 are exposed are perpendicular to a main surface of the substrate 210. On the other hand, in the region 220*d* on the side surface of the trench 220 where the second n-type layer 214 is exposed, a region 220*d*1 from a surface of the first p-type layer 212 to a certain height H in the second n-type layer 214 is perpendicular to the main surface of the substrate 210, and a region 220*d*2 from the height H in the second n-type layer 214 to an upper surface of the trench 220 (a region in the vicinity of the trench 220 on the surface of the second n-type layer 214) is inclined by an angle of θ with respect to the main surface of the substrate 210. The inclination is such an inclination that a cross-sectional area of the trench 220 at the region 220*d*2 in a plane parallel to a bottom surface of the trench 220 increases from a bottom surface side toward an upper surface side of the trench 220.

As described above, the trench 220 has a shape in which a corner portion formed by the side surface and the upper surface of the trench 220 is chamfered. Therefore, the gate electrode 217 is not largely bent at the corner portion formed by the side surface and the upper surface of the trench 220, and is bent stepwise at a gentle angle. Therefore, coverage of the gate electrode 217 can be improved.

Although a length of a side of the region 220*c* on the side surface of the trench 220 where the first p-type layer 212 is exposed is a channel length, since the region 220*c* is perpendicular to the main surface of the substrate 210, there is no change in the channel length as compared with a structure in the related art (when an entire region of the side surface of the trench 220 is perpendicular thereto). Therefore, an increase in on-resistance can be prevented while improving the coverage of the gate electrode 217.

In addition, since the corner portion formed by the side surface and the upper surface of the trench 220 is chamfered, a path of a current flowing on the surface of the second n-type layer 214 is shortened. As a result, resistance of the device can be reduced.

The regions 220*c* and 220*d*1 on the side surface of the trench 220 do not need to be strictly perpendicular to the main surface of the substrate 210, and an angle thereof may be in a range of 80° to 90°. In addition, the regions 220*a* and 220*b* on the side surface of the trench 220 may be perpendicular or inclined, and an angle thereof may be, for example, 450 to 90°.

The inclination angle θ of the region 220*d*2 on the side surface of the trench 220 is any value as long as the value is larger than 0° and smaller than inclination angles of the other regions (220*a*, 220*b*, 220*c*, and 220*d*1) on the side surface, and is preferably 15° to 75°. Within this range, the coverage of the gate electrode 217 can be further improved. In addition, the inclination angle θ may change stepwise or continuously.

A width W of the region 220*d*2 ((H0−H)/tan θ when a thickness of the second n-type layer 214 is referred to as H0) is preferably 0.1 μm to 0.3 μm. Within this range, the coverage of the gate electrode 217 can be further improved.

The height H may be any value as long as the value is equal to or greater than 0 and equal to or less than the thickness H0 of the second n-type layer 214, and the height H is preferably set such that the inclination angle θ is 150 to 750 and the width W is 0.1 μm to 0.3 μm.

The ion implantation region 215 is located in the vicinity of the surface of the first p-type layer 212. The ion implantation region 215 is a p-type region where Mg ions are implanted into the surface of the first p-type layer 212, and is a region for forming the p-type impurity region 213. A side surface of the ion implantation region 215 is provided on an inner side with respect to the side surface of the first p-type layer 212 and is not exposed to the side surface of the trench 220. This is because the side surface of the trench 220 is a device operation region, and when the ion implantation region 215, which is a region damaged due to ion implantation, is exposed on the side surface of the trench 220, there is a possibility that an operation of the device is adversely affected.

The p-type impurity region 213 is located in a region in the vicinity of the surface of the first n-type layer 211 under the ion implantation region 215. The p-type impurity region 213 is a region formed by diffusion of Mg in the first p-type layer 212 and the ion implantation region 215. The p-type impurity region 213 can reduce an electric field concentrated on a corner portion 220*e* formed by the bottom surface and the side surface of the trench 220. A Mg concentration of the p-type impurity region 213 is, for example, $1\times10^{17}/cm^3$ to $2\times10^{18}/cm^3$, and the Mg concentration decreases as the depth increases. A bottom surface of the p-type impurity region 213 is a curved surface protruding toward a substrate 210 side. In addition, a width of the p-type impurity region 213 is approximately the same as that of the first p-type layer 212 partitioned by the trench 220.

Figure 7:
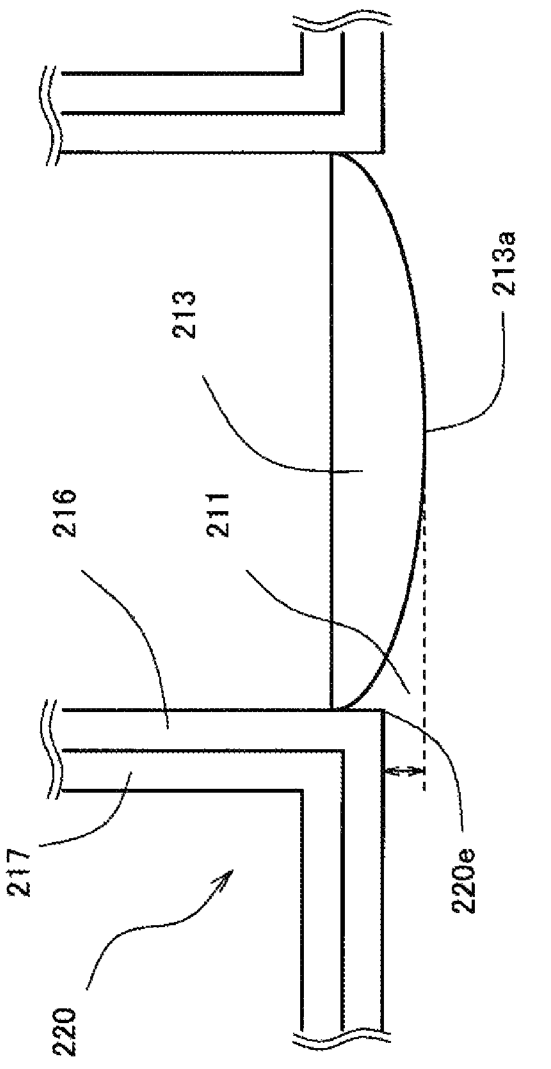
FIG. 7 is an enlarged view illustrating a part of the trench 220.

A thickness of the p-type impurity region 213 may be any value, and is preferably set as follows. It is preferable that the corner portion 220*e* formed by the side surface and the bottom surface of the trench 220 is not covered with the p-type impurity region 213 (see FIG. 7). By bringing the corner portion 220*e* of the trench 220 into contact with the first n-type layer 211, a channel is easily formed at the corner portion 220*e*, and an increase in resistance can be prevented. Alternatively, the corner portion 220*e* of the trench 220 may have a thickness such that the corner portion 220*e* is in contact with the p-type impurity region 213. By covering the corner portion 220*e* with the p-type impurity region 213, electric field concentration at the corner portion 220*e* of the trench 220 can be further reduced, and a breakdown voltage and reliability can be further improved. In addition, it is preferable that a lower surface 213*a* of a central portion (thickest portion) of the p-type impurity region 213 is located on a lower side with respect to the bottom surface of the trench 220 (substrate 210 side). The electric field concentration at the corner portion 220*e* of the trench 220 can be further reduced.

The gate insulating film 216 is provided in a film shape along the bottom surface, the side surface, and the upper surface of the trench 220. Here, the upper surface of the trench 220 is a region in the vicinity of the trench 220 on the surface of the second n-type layer 214. The gate insulating film 216 is formed of $SiO_2$, for example.

The gate electrode 217 is provided in a film shape along the bottom surface, the side surface, and the upper surface of the trench 220 via the gate insulating film 216. The gate electrode 217 is formed of Al, for example. Here, since the region 220*d*2 on the side surface of the trench 220 is inclined, the coverage of the gate electrode 217 can be improved.

The drain electrode 218 is provided on a rear surface of the substrate 210. The drain electrode 218 is formed of Ti/Al, for example.

A groove (recess) 221 having a depth penetrating through the second n-type layer 214 and the ion implantation region 215 and reaching the first p-type layer 212 is provided in a central portion of the surface of the second n-type layer 214 in plan view. The first p-type layer 212 is exposed at a bottom surface of the recess 221.

The source electrode 219 is provided continuously on the surface of the second n-type layer 214, and a side surface and the bottom surface of the recess 221. The source electrode 219 is formed of Ti/Al, for example. The source electrode 219 is not in contact with the p-type impurity region 213 which is damaged due to ion implantation, but in contact with the first p-type layer 212 which is not damaged. Therefore, contact resistance of the source electrode 219 can be reduced. Similarly to the first embodiment, the body electrode may be provided continuously on the bottom surface, the side surface, and an upper surface of the recess 221.

In the semiconductor device according to the second embodiment, the p-type impurity region 213 is provided only in an intended region, and a device structure as designed can be implemented. In addition, in the semiconductor device according to the second embodiment, since an n-type region on the surface of the first p-type layer 212 is referred to as the second n-type layer 214 formed by epitaxial growth instead of ion implantation, the Si concentration can be easily controlled and the concentration can be increased. Further, since the second n-type layer 214 is not damaged by ion implantation, there is no concern about performance degradation such as an increase in resistance. Therefore, the resistance can be reduced.

Further, in the semiconductor device according to the second embodiment, the region on the side surface of the trench 220 where the second n-type layer 214 is exposed is inclined. Therefore, similar as in the first embodiment, an increase in on-resistance can be prevented while improving the coverage of the gate electrode 15.

Next, a method for producing the semiconductor device according to the second embodiment will be described with reference to the drawings.

Figure 8A:
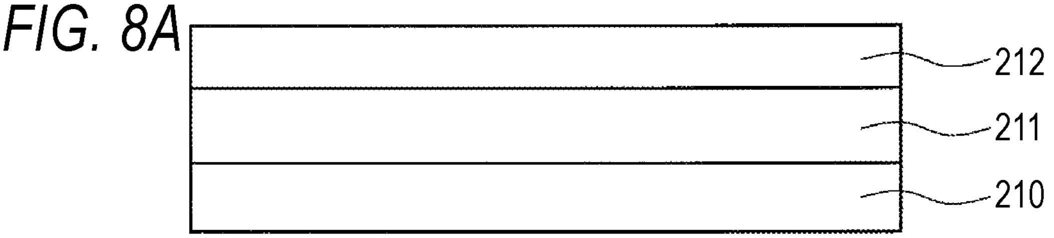
FIGS. 8A, 8B, 8C, 8D, and 8E are views illustrating a process of producing the semiconductor device according to the second embodiment.

First, the first n-type layer 211 formed of n-GaN and the first p-type layer 212 formed of p-GaN are stacked in this order on the substrate 210 formed of n-GaN by a MOCVD method (see FIG. 8A). Then, heat treatment is performed to activate Mg in the first p-type layer 212 to be p-type.

Figure 8B:
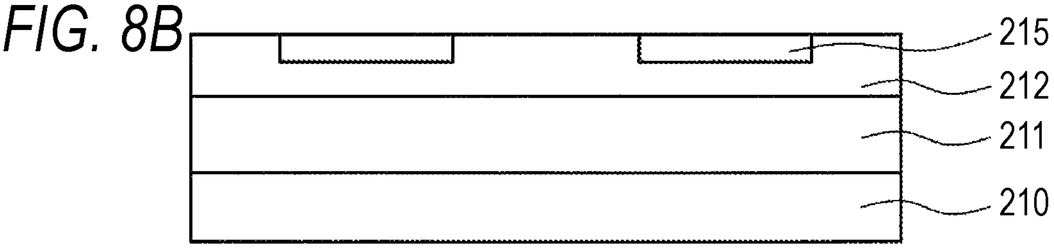

Next, a through film (not illustrated) formed of AlN is formed on the first p-type layer 212 by the MOCVD method, and Mg is ion-implanted into the surface of the first p-type layer 212 to form the ion implantation region 215. A region where ions are implanted is set to be on an inner side with respect to a region of the first p-type layer 212 which is scheduled to be partitioned in the subsequent process. A photoresist or the like can be used as a mask formed in a region where ions are not implanted. The through film is for controlling an amount of ions implanted into the first p-type layer 212. The ion implantation is performed under conditions of, for example, 500° C., an acceleration voltage of 230 keV, and a dose amount of $2.3\times10^{14}/cm^2$. After the ion implantation, the through film and the mask are removed (see FIG. 8B).

As ions to be implanted, ions other than Mg may be used as long as the ions are p-type impurities, for example, Be may be ion-implanted. In addition, the ion implantation may be performed in a plurality of times, and ion distribution in a depth direction can be controlled more satisfactorily. Further, the ion implantation may be performed from a direction at an angle with respect to a direction perpendicular to the surface of the first p-type layer 212 while rotating the substrate 210. A width of concentration distribution of the implanted ions in the depth direction can be narrowed, and the ions can be implanted into a target position with high accuracy.

Figure 8C:
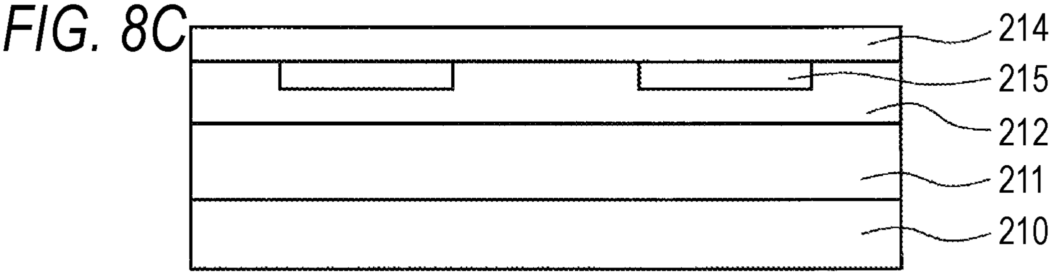

Next, the second n-type layer 214 formed of n-GaN is formed on the first p-type layer 212 and the ion implantation region 215 by the MOCVD method (see FIG. 8C).

Figure 8D:
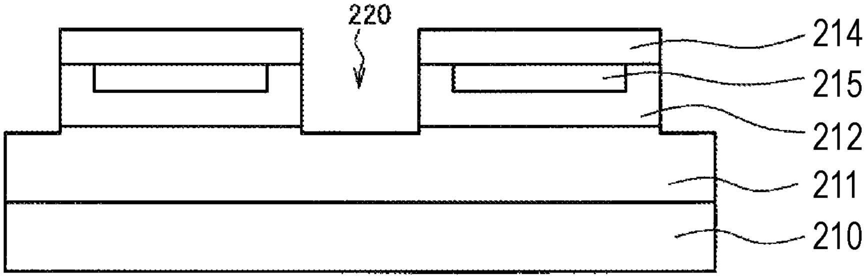

Next, a predetermined region of the surface of the second n-type layer 214 is dry-etched until reaching the first n-type layer 211 to form the trench 220 (see FIG. 8D). The first p-type layer 212 is partitioned into predetermined regions by the trench 220, and the first p-type layer 212 in a region where the p-type impurity region 213 is not to be formed is removed. In addition, since the ion implantation region 215 has a pattern on an inner side with respect to the region of the first p-type layer 212 which is scheduled to be partitioned, the ion implantation region 215 is located on an inner side of the partitioned first p-type layer 212. Therefore, the ion implantation region 215 is not exposed on the side surface of the trench 220.

Figure 8E:
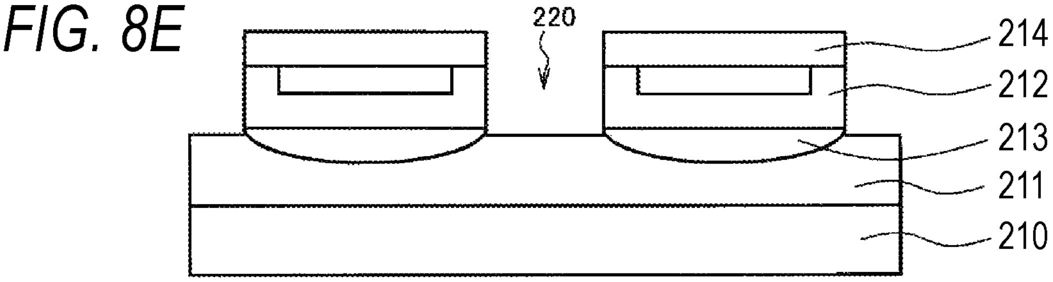

Next, heat treatment is performed. An atmosphere of the heat treatment may be an inactive gas atmosphere, for example, a nitrogen atmosphere. In addition, a heat treatment temperature is 1,000° C. to 1,100° C., and a heat treatment time is 5 minutes to 120 minutes. By this heat treatment, Mg contained in the first p-type layer 212 and the ion implantation region 215 is diffused into a region below the ion implantation region 215 on a surface side of the first n-type layer 211. As a result, the p-type impurity region 213 is formed in a region below the ion implantation region 215 from the surface of the first n-type layer 211 to a predetermined depth (see FIG. 8E).

Here, since the trench 220 is formed before the heat treatment, Mg does not diffuse in a lateral direction beyond the trench 220. Therefore, the width of the p-type impurity region 213 is approximately the same as the width of the first p-type layer 212 partitioned by the trench 220.

The diffusion of Mg to the substrate 210 side decreases as closer to the side surface of the trench 220, and increases as away from the side surface. As a result, the bottom surface of the p-type impurity region 213 becomes a curved surface protruding toward the substrate 210 side.

The thickness of the p-type impurity region 213 can be controlled according to ion implantation conditions, heat treatment conditions, the thickness of the first p-type layer 212, a Mg concentration, and the like. For example, under the ion implantation conditions, the p-type impurity region 213 can be thickened by increasing the dose amount. In addition, under the heat treatment conditions, the p-type impurity region 213 can be thickened by increasing the heat treatment time.

It is preferable that the corner portion 220*e* formed by the side surface and the bottom surface of the trench 220 is not covered with the p-type impurity region 213 by controlling the thickness of the p-type impurity region 213. By bringing the corner portion 220*e* of the trench 220 into contact with the first n-type layer 211, a channel is easily formed at the corner portion 220*e*, and an increase in resistance can be prevented.

Alternatively, the corner portion 220*e* of the trench 220 is preferably in contact with the p-type impurity region 213. By covering the corner portion 220*e* with the p-type impurity region 213, electric field concentration at the corner portion 220*e* of the trench 220 can be further reduced, and a breakdown voltage and reliability can be further improved.

In addition, it is preferable that the thickest portion of the p-type impurity region 213 is on the substrate 210 side with respect to the bottom surface of the trench 220 by controlling the thickness of the p-type impurity region 213. The electric field concentration at the corner portion 220*e* of the trench 220 can be further reduced.

Figure 9A:
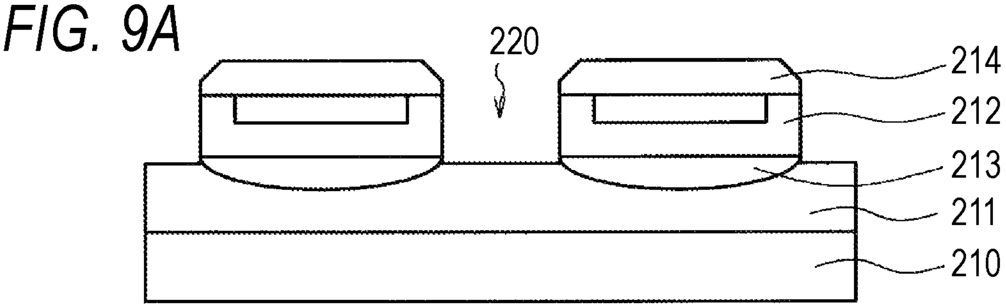
FIGS. 9A, 9B, and 9C are views illustrating a process of producing the semiconductor device according to the second embodiment.

Next, an entire upper surface of a wafer is dry-etched. In this dry-etching, since a convex portion on the upper surface is preferentially etched, the corner portion formed by the side surface and the upper surface of the trench 220 is preferentially etched. As a result, the corner portion is chamfered to form an inclined side surface in the region 220*d*2 on the side surface of the trench 220, and the other regions 220*a*, 220*b*, 220*c*, and 220*d*1 on the side surface remain perpendicular thereto (see FIG. 9A).

In addition, the dry-etching removes thermal damage generated on the side surface of the trench 220 due to the heat treatment in the previous process. In the related art, thermal damage is prevented by forming a protective film before heat treatment, but in the second embodiment, the formation is not necessary, and the producing process can be further simplified.

A chlorine-based gas such as $Cl_2$, $BCl_3$, or $SiCl_4$ is used as an etching gas. In particular, $Cl_2$ is preferable. This is because adhesion of impurities (B or Si) to the first p-type layer 212 can be prevented.

In addition, since the dry-etching is performed on the entire upper surface and no mask is used, a margin for mask formation is not necessary. Therefore, the device can be miniaturized, and chip resistance can be reduced by the miniaturization.

Wet-etching may be used instead of the dry-etching. However, in a case of wet-etching, it is necessary to cover a region not to be etched with a mask. As a wet-etching solution, an aqueous solution such as a TMAH can be used. In addition, in a case of wet-etching using the TMAH, a specific plane orientation (m-plane) can be expressed on the side surface of the trench 220 due to anisotropy, and thus the on-resistance can be reduced. Further, since an etching rate becomes very slow at a stage where the specific plane orientation is expressed, the TMAH functions as an etching stopper and is excellent in reproducibility of the shape and the like.

Figure 9B:
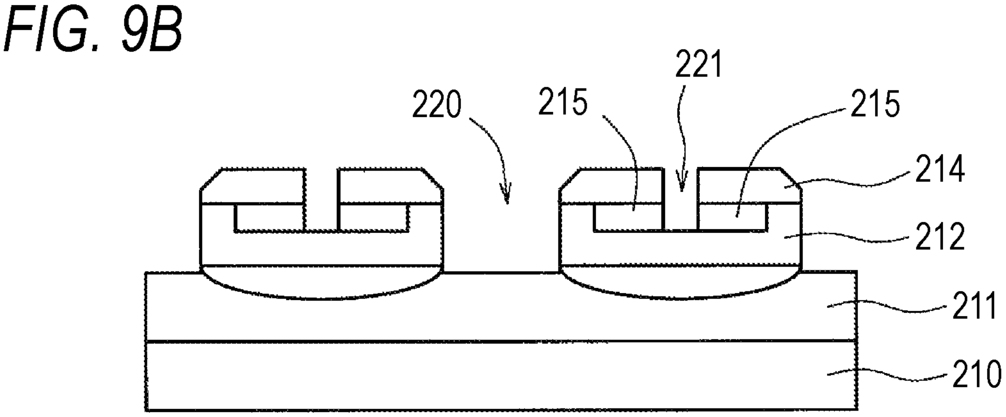

Next, a predetermined region of the surface of the second n-type layer 214 is dry-etched until reaching the first p-type layer 212 to form the recess 221 (see FIG. 9B). After the trench 220 and the recess 221 are formed, the entire upper surface of the wafer may be dry-etched. In this case, since a corner of the recess 221 can also be chamfered, coverage of the source electrode 219 can be improved.

Figure 9C:
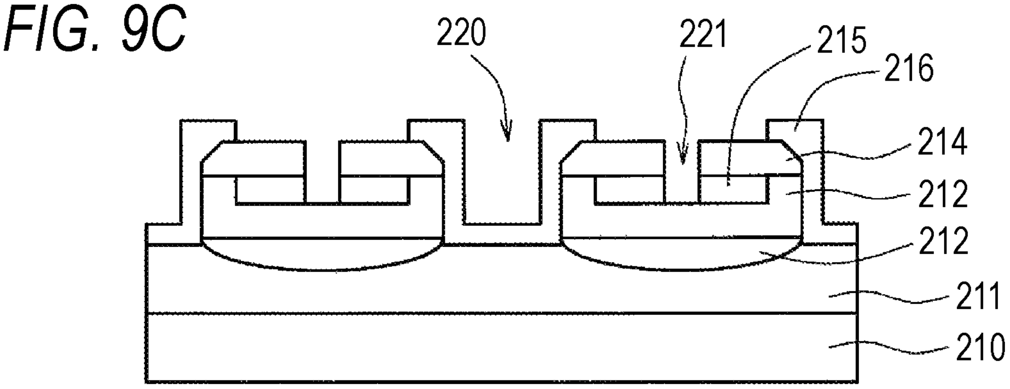

Next, the gate insulating film 216 is formed in a film shape along the bottom surface, the side surface, and the upper surface of the trench 220 by the ALD method (see FIG. 9C).

Next, the source electrode 219 is formed continuously on the second n-type layer 214, the side surface of the recess 221, and the bottom surface of the recess 221 by vapor deposition or sputtering. Next, the gate electrode 217 is formed on the bottom surface, the side surface, and the upper surface of the trench 220 via the gate insulating film 216 by vapor deposition. Next, the drain electrode 218 is formed on the rear surface of the substrate 210 by vapor deposition. Thus, the semiconductor device according to the second embodiment is prepared.

As described above, according to the method for producing the semiconductor device of the second embodiment, after the ion implantation and before the heat treatment, the trench 220 having the depth reaching the first n-type layer 211 is formed, and the first p-type layer 212 in the region where the p-type impurity region 213 is not to be formed is removed, so that Mg in the first p-type layer 212 and the ion implantation region 215 can be prevented from being diffused beyond the trench 220 in the lateral direction. As a result, the p-type impurity region 213 can be formed in an intended region, and the device structure as designed can be implemented.

Further, in the second embodiment, the damage due to the heat treatment can be removed, and the etching can be performed such that the region 220*d*2 on the side surface of the trench 220 is inclined. Therefore, the producing process can be simplified, and similar as in the first embodiment, an increase in on-resistance can be prevented while improving the coverage of the gate electrode 15.

MODIFICATION

Although the first and second embodiments relate to trench gate type vertical MISFETs, the present disclosure can be applied to any semiconductor device as long as the semiconductor device is of a trench gate type. For example, the present disclosure is also applicable to an IGBT or the like. In addition, the present disclosure is not limited to a vertical type and can be applied to a horizontal type device.

The present disclosure can be applied to a power device or the like.

What is claimed is:

1. A semiconductor device formed of a group III nitride semiconductor, of trench gate type, comprising:

a substrate;

a first layer formed of an n-type group III nitride semiconductor and provided on the substrate;

a second layer formed of a p-type group III nitride semiconductor and provided on the first layer;

a third layer formed of an n-type group III nitride semiconductor and provided on the second layer; and a trench provided in a partial region of a surface of the third layer and having a depth penetrating through the third layer and the second layer and reaching the first layer, wherein a region on a side surface of the trench where the second layer is exposed is perpendicular to a main surface of the substrate, and a region on the side surface of the trench where the third layer is exposed includes a first region from a surface of the second layer to a predetermined height in the third layer, and a second region from the predetermined height in the third layer to the surface of the third layer, the first region being perpendicular to the main surface of the substrate, the second region being inclined with respect to the main surface of the substrate, a cross-sectional area of the trench at the second region in a plane parallel to a bottom surface of the trench increasing from a bottom surface side toward an upper surface side of the trench, wherein a width of the second region in a direction parallel to the main surface of the substrate is 0.1 μm to 0.3 μm.

2. The semiconductor device according to claim 1, further comprising:

an ion implantation region formed by implanting ions into a predetermined region of the surface of the second layer; and a p-type impurity region formed under the ion implantation region in a region having a predetermined depth from a surface of the first layer and a width of the second layer.

3. The semiconductor device according to claim 1, wherein an inclination angle of the second region is 15° to 75°.

4. The semiconductor device according to claim 1, further comprising a recess provided in a region different from a formation region of the trench.

5. The semiconductor device according to claim 4, wherein a corner of the recess is chamfered.

6. The semiconductor device according to claim 5, wherein the corner portion is chamfered to form an inclined side surface in a region on the side surface of the trench, and other regions on the side surface remain perpendicular thereto.

7. The semiconductor device according to claim 1, wherein the region on the side surface of the trench is inclined at an angle thereof of 45° to 90°.

8. The semiconductor device according to claim 1, wherein an upper surface of the trench on the surface of the third layer is inclined by a predetermined angle with respect to the main surface of the substrate, the inclination is such that a cross-sectional area of the trench at a region in a plane parallel to a bottom surface of the trench increases from a bottom surface side toward an upper surface side of the trench.

9. A method for producing a semiconductor device formed of a group III nitride semiconductor, of trench gate type, comprising:

a first process of forming, on a substrate, a first layer formed of an n-type group III nitride semiconductor, a second layer formed of a p-type group III nitride semiconductor, and a third layer formed of an n-type group III nitride semiconductor in this order;

a second process of forming, in a partial region of a surface of the third layer, a trench having a depth penetrating through the third layer and the second layer and reaching the first layer, a side surface of the trench being perpendicular to a main surface of the substrate; and a third process of etching the side surface of the trench, a region on the side surface of the etched trench where the third layer is exposed including a first region from a surface of the second layer to a predetermined height in the third layer, and a second region from the predetermined height in the third layer to the surface of the third layer, the first region being perpendicular to the main surface of the substrate, the second region being inclined with respect to the main surface of the substrate, a cross-sectional area of the etched trench at the second region in a plane parallel to a bottom surface of the etched trench increasing from a bottom surface side toward an upper surface side of the etched trench, wherein a width of the second region in a direction parallel to the main surface of the substrate is 0.1 μm to 0.3 μm.

10. The method for producing the semiconductor device according to claim 9, wherein the third process is a process of dry-etching an entire upper surface of a wafer.

11. The method for producing the semiconductor device according to claim 9, wherein the first process includes a process of implanting ions into a predetermined region of the surface of the second layer to form an ion implantation region, the process being performed after formation of the second layer and before formation of the third layer, the method further comprises a fourth process of diffusing a p-type impurity in the second layer by heat treatment to form a p-type impurity region in a region having a predetermined depth from the surface of the first layer and a width of the second layer under the ion implantation region, the forth process being performed after the second process and before the third process, and the third process also serves to remove thermal damage generated on the side surface of the trench due to the fourth process.

12. The method for producing the semiconductor device according to claim 9, further comprising forming a recess provided in a region different from a formation region of the trench.

13. The method for producing the semiconductor device according to claim 12, wherein a corner of the recess is chamfered.

14. The method for producing the semiconductor device according to claim 13, wherein the corner portion is chamfered to form an inclined side surface in a region on the side surface of the trench, and other regions on the side surface remain perpendicular thereto.

15. The method for producing the semiconductor device according to claim 9, further comprising an ion implantation region formed by implanting ions into a predetermined region of the surface of the second layer.

16. The method for producing the semiconductor device according to claim 9, further comprising a p-type impurity region formed under the ion implantation region in a region having a predetermined depth from a surface of the first layer and a width of the second layer.

17. The method for producing the semiconductor device according to claim 9, wherein an inclination angle of the second region is 15° to 75°.

18. The method for producing the semiconductor device according to claim 9, wherein the inclination angle is larger than 0° and smaller than inclination angles of any other region.

19. A semiconductor device formed of a group III nitride semiconductor, of trench gate type, comprising:

a substrate;

a first layer formed of a first conductive type group III nitride semiconductor and provided on the substrate;

a second layer formed of a second conductive type group III nitride semiconductor and provided on the first layer;

a third layer formed of the first conductive type group III nitride semiconductor and provided on the second layer; and a trench provided in a partial region of a surface of the third layer and having a depth penetrating through the third layer and the second layer and reaching the first layer, wherein a region on a side surface of the trench where the second layer is exposed is perpendicular to a main surface of the substrate, and a region on the side surface of the trench where the third layer is exposed includes a first region from a surface of the second layer to a predetermined height in the third layer, and a second region from the predetermined height in the third layer to the surface of the third layer, the first region being perpendicular to the main surface of the substrate, the second region being inclined with respect to the main surface of the substrate, a cross-sectional area of the trench at the second region in a plane parallel to a bottom surface of the trench increasing from a bottom surface side toward an upper surface side of the trench, wherein a width of the second region in a direction parallel to the main surface of the substrate is 0.1 μm to 0.3 μm.

20. The semiconductor device according to claim 19, wherein an inclination angle of the second region is 15° to 75°.

* * * * *